United States Patent
McCall et al.

(10) Patent No.: US 9,153,296 B2
(45) Date of Patent: Oct. 6, 2015

(54) METHODS AND APPARATUSES FOR DYNAMIC MEMORY TERMINATION

(75) Inventors: James A. McCall, Portland, OR (US); Kuljit S. Bains, Olympia, WA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/533,482

(22) Filed: Jun. 26, 2012

(65) Prior Publication Data

US 2012/0326746 A1    Dec. 27, 2012

Related U.S. Application Data (63) Continuation-in-part of application No. 12/824,698, filed on Jun. 28, 2010, now Pat. No. 8,274,308.

(51) Int. Cl.
*H03K 17/16* (2006.01)
*G11C 7/10* (2006.01)

(52) U.S. Cl.
CPC ............ *G11C 7/1045* (2013.01); *G11C 7/1051* (2013.01); *G11C 7/1057* (2013.01); *G11C 7/1078* (2013.01); *G11C 7/1084* (2013.01)

(58) Field of Classification Search
CPC .................. H03K 19/0005; H04L 25/0298
USPC ............................................................. 326/30
See application file for complete search history.

(56) References Cited

U.S. PATENT DOCUMENTS

| | | | |
|---|---|---|---|
| 2003/0218477 A1* | 11/2003 | Jang et al. | 326/30 |
| 2004/0100837 A1* | 5/2004 | Lee | 365/200 |
| 2007/0247185 A1* | 10/2007 | Oie et al. | 326/30 |
| 2010/0013516 A1* | 1/2010 | Kyung | 326/30 |
| 2010/0182817 A1* | 7/2010 | Koshizuka | 365/51 |
| 2010/0226185 A1* | 9/2010 | Lee | 365/189.05 |
| 2010/0232196 A1* | 9/2010 | Jo et al. | 365/51 |
| 2011/0095783 A1* | 4/2011 | Ferolito et al. | 326/30 |

* cited by examiner

*Primary Examiner* — Jason M Crawford
(74) *Attorney, Agent, or Firm* — Vincent Anderson Law PC (57) ABSTRACT

Described herein are a method and an apparatus for dynamically switching between one or more finite termination impedance value settings to a memory input-output (I/O) interface of a memory in response to a termination signal level. The method comprises: setting a first termination impedance value setting for a termination unit of an input-output (I/O) interface of a memory; assigning the first termination impedance value setting to the termination unit when the memory is not being accessed; and switching from the first termination impedance value setting to a second termination impedance value setting in response to a termination signal level.

17 Claims, 8 Drawing Sheets

| Address | Operating Mode | Description | |
|---|---|---|---|
| BG1 | RFU | 0 = must be programmed to 0 during MRS | |
| BG0, BA1:BA0 | MR Select | 000 = MR0　　100 = MR4　001 = MR1　　101 = MR5　010 = MR2　　110 = MR6　011 = MR3　　111 = RCW[1] | |
| A13 | RFU | 0 = must be programmed to 0 during MRS | |
| A12 | Read DBI | 0 = Disable　　1 = Enable | |
| A11 | Write DBI | 0 = Disable　　1 = Enable | |
| A10 | Data Mask | 0 = Disable　　1 = Enable | |
| A9 | RFU | 0 = must be programmed to 0 during MRS | |
| A8:A6 | RTT_PARK | (see Table FIG. 5B) | |
| A5 | ODT Input Buffer for Power Down | 0 = Disable1 = Enable | |
| A4 | C/A Parity Error Status | 0 = Clear | 1 = Error |
| A3 | CRC Error Clear | 0 = Clear | 1 = Error |

FIG. 5A

| A8 | A7 | A6 | RTT_PARK |
|----|----|----|----------|
| 0 | 0 | 0 | RTT_PARK Disable |
| 0 | 0 | 1 | RZQ/4 |
| 0 | 1 | 0 | RZQ/2 |
| 0 | 1 | 1 | RZQ/6 |
| 1 | 0 | 0 | RZQ/1 |
| 1 | 0 | 1 | RZQ/5 |
| 1 | 1 | 0 | RZQ/3 |
| 1 | 1 | 1 | RZQ/7 |

FIG. 5B

| RTT_PARK MR5{A8:A6} | RTT_NOM MR1 {A9:A6:A2} | ODT pin | DRAM termination state |
| --- | --- | --- | --- |
| Enabled | Enabled | HIGH | RTT_NOM |
| Enabled | Enabled | LOW | RTT_PARK |
| Enabled | Disabled | Don't care[3] | RTT_PARK |
| Disabled | Enabled | HIGH | RTT_NOM |
| Disabled | Enabled | LOW | Hi-Z |
| Disabled | Disabled | Don't care[3] | Hi-Z |

FIG. 6

METHODS AND APPARATUSES FOR DYNAMIC MEMORY TERMINATION

This application is a continuation-in-part of U.S. patent application Ser. No. 12/824,698, filed Jun. 28, 2010, now U.S. Pat. No. 8,274,308 entitled "A METHOD AND APPARATUS FOR DYNAMIC MEMORY TERMINATION" by McCall, et al.

FIELD OF THE INVENTION

Embodiments of the invention relate generally to the field of memories. More particularly, embodiments of the invention relate to a method and an apparatus for dynamically switching between one or more finite termination impedance value settings to a memory input-output (I/O) interface of a memory in response to a termination signal level.

BACKGROUND

In a typical memory system of a computer system, a memory controller facilitates the access of a memory module in the computer system. The memory module may include one or more memories that are referred to as ranks. The memory controller communicates with the ranks of the memory module via input-output (I/O) interfaces and transmission lines. The I/O interfaces exist at both the memory controller end and at the memory module end. The memory controller transmits via its I/O interfaces a host of signals to the ranks including address signals, control signals, clock signals, etc., to access data from the ranks or to send data to the ranks.

For correct communication between the ranks and the memory controller, termination impedance is set on the I/O interfaces of the memory controller and/or the ranks. The term correct communication herein refers to sending and/or receiving expected data between the memory module and the memory controller, where the expected data meets performance specifications e.g., timing, voltage margin, signal integrity, etc. The value of the termination impedance impacts the quality of the signal being communicated between the memory controller and the ranks.

Typically, during memory access (e.g., memory read) initiated by the memory controller, a termination impedance of the I/O interface at the ranks is set to a value for reducing noise on the signal being communicated between the rank and the memory controller. For example, for a Double Data Rate 3 (DDR3) I/O interface, the memory controller is only operable to set the termination impedance on the DDR3 I/O interface of the ranks being accessed to a single finite termination value. The termination impedance for DDR3 I/O interface of ranks not being accessed is set to a high impedance value (e.g., infinite impedance caused by tri-stating the termination devices) as a default termination impedance value.

One reason for having the default termination impedance value for the DDR3 I/O interface as a high impedance value is to reduce power consumption. DDR3 I/O interfaces are required by specification to have a center-tap termination scheme having a pull-up termination resistor connected to a power supply node and a pull-down termination resistor connected to a ground supply node. Such a center-tap termination scheme provides an electrical path from the power supply node to the ground node via the pull-up termination resistor and the pull-down termination resistor. The electrical path is a source of power consumption when the center-tap termination scheme is enabled.

To reduce power consumption on the DDR3 I/O interface when there is no memory access on a rank, the termination impedance of the rank remains at default value of high impedance. Such high termination impedance (i.e., infinite impedance) reduces timing and voltage margins on the read signals being communicated between the memory controller and other active ranks. As demand for higher speeds of memory I/O interfaces is increasing e.g., DDR3 I/O interface speed of 1600-3200 Mega Transfers per second (MT/s) vs. 800-1600 MT/s for Double Data Rate 4 (DDR4) I/O interface, a default value of high termination impedance reduces memory system performance.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention relate to a method and an apparatus for dynamically switching between one or more finite termination impedance value settings to a memory input-output (I/O) interface of a memory in response to a termination signal level.

On-die termination (ODT) is a feature of the Double Data Rate 4 (DDR4) dynamic random access memory (DRAM) that allows the DRAM to change termination resistance for each DQ, DQS_t, DQS_c and DM_n for ×4 and ×8 configurations (and TDQS_t, TDQS_c, for ×8 configuration when enabled via A11 (=1) in Mode Register 1) via the ODT control pin or Write Command or Default Parking value with Mode Register setting. For ×16 configurations, ODT is applied to each DQU, DQL, DQSU_t, DQSU_c, DQSL_t, DQSL_c, DMU_n and DML_n signal. The ODT feature is designed to improve signal integrity of the memory channel by allowing the DRAM controller to independently change termination resistance for any or all DRAM devices. More details about ODT control modes and ODT timing modes are provided below.

In one embodiment, a memory controller reads a first finite impedance value setting from a register and assigns that value setting to a termination unit of one of the memory ranks which are not being accessed. In contrast to having a high impedance termination value for ranks as a default value when there is no memory access, as is the case for Double Data Rate 3 (DDR3) I/O interfaces, in the embodiment herein a first programmable finite impedance value setting is assigned to the termination unit of the ranks that are not being accessed. In one embodiment, a second termination impedance value setting is assigned to the ranks being accessed when a termination signal level asserts. In the embodiments discussed herein, both the first and the second termination impedance values are programmable.

In one embodiment, when the memory controller initiates memory access from one of the ranks, a termination unit of the rank from which data is being accessed is configured to have the second termination impedance value. In such an embodiment, the termination unit of the rank being accessed is operable to transition its termination impedance value setting from the first finite programmable termination impedance value setting to the second termination impedance value setting when the termination signal level asserts. As discussed below, the termination signal is an on-die termination signal.

The embodiments herein result in 20-30% improvement in timing and voltage margins for memory accesses of ranks compared to the traditional architecture that is configured to transition from a high impedance termination value setting to a finite impedance termination value setting during memory access of a rank. Consequently, the embodiments herein result in higher yield (i.e., fewer failing parts) of memory systems because the timing margin improves over memory systems that do not allow dynamic switching of termination impedance value settings for its termination units.

The term dynamic switching herein refers to switching between finite impedance value settings for the termination units of the ranks without causing the termination units to transition into a high impedance state or any other intermediary impedance state. Such switching occurs directly from one termination impedance value setting to another termination impedance value setting in response to a memory access when the termination signal level changes from one logical level to another logical level.

The term high impedance herein refers to infinite impedance caused by turning off the termination unit (i.e., setting the termination unit to tri-state) resulting in full reflection of signals on the transmission line at the termination unit end. In one embodiment, the I/O interface is a Double Date Rate 4 (DDR4) interface having a termination unit that comprises pull-up resistors and no pull-down resistors. In one embodiment, the I/O interface comprises a termination unit having pull-down resistors and no pull-up resistors.

In one embodiment of the invention, the one or more ranks include a Synchronous Dynamic Random Access Memory (SDRAM), Dynamic Random Access Memory (DRAM), RAMBUS Dynamic Random Access Memory (RDRAM), DDR4 SDRAM, and any other type of random access memory device. In one embodiment, the ranks reside in a memory module.

So as not to obscure the embodiments of the invention, the embodiments herein are discussed with reference to a Dual In-Line Memory Module (DIMM) having one or more SDRAMs, which are also called ranks, wherein the DIMM is communicatively coupled to the memory module via a DDR4 I/O interface. However, the above embodiments are not limiting embodiments. Other embodiments having different memory modules (other than the DIMM), memories without memory modules, and other I/O interfaces (e.g., newer I/O interfaces than a DDR4 I/O interface) can be used without changing the essence of the invention.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme, e.g., differential pair, single-ended, etc.

Figure 1:
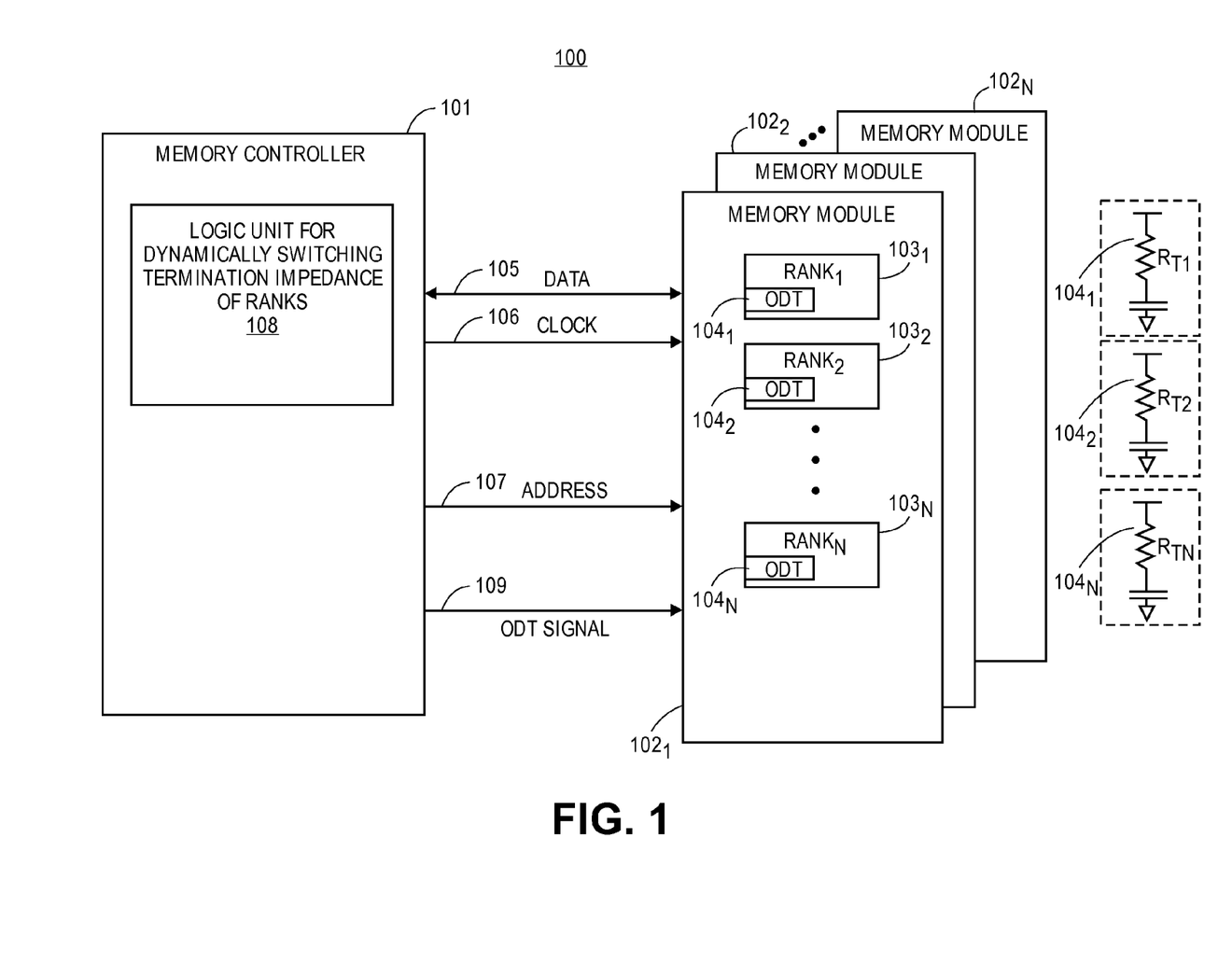
FIG. 1 is a memory system comprising a memory controller and memory modules for dynamically providing finite termination impedance settings to ranks within the memory modules, according to one embodiment of the invention.

FIG. 1 is a memory system 100 comprising a memory controller 101 operable to dynamically set programmable finite termination impedance values for memory modules $102_{1-N}$, according to one embodiment of the invention. In one embodiment, the memory controller 101 is integrated within a microprocessor (CPU). In other embodiments, the memory controller 101 is a separate integrated circuit (IC) on the motherboard and is coupled to the CPU (not shown) and the memory modules $102_{1-N}$ via motherboard routings (not shown) and connectors (not shown).

In one embodiment of the invention, the memory module $102_1$ includes one or more memories, register devices, buffer devices, etc. The one or more memories are also referred herein as ranks. In one embodiment the ranks $103_{1-N}$ are SDRAMs. In one embodiment, the ranks $103_{1-N}$ share the same address, command and control buses.

In one embodiment, the ranks $103_{1-N}$ are not in a memory module. In one embodiment, the memory controller 101 communicates with the memory module $102_1$ via signals including data signals 105, clock signals 106, address signals 107, on-die termination (ODT) signal 109, and any other signals to cause communication between the memory controller 101 and the memory modules $102_{1-N}$.

In one embodiment, each I/O pin/pad (not shown) of the ranks $103_{1-N}$ has a termination unit $104_{1-N}$. In one embodiment, the termination units $104_{1-N}$ are implemented within the die of the ranks $103_{1-N}$ i.e., ODT units. In other embodiments, the termination units $104_{1-N}$ are implemented off-die.

So as not to obscure the embodiments of the invention, the I/O pins/pads of each rank are not shown. Also, the termination units $104_{1-N}$ discussed for the embodiments herein are ODT units to cancel signal reflections on the transmission lines during memory access. One skilled in the art can replace the ODT units with off-die termination units without changing the essence of the embodiments.

In one embodiment, when the memory controller 101 asserts the ODT signal 109, the ranks being accessed set their ODT units to have the second termination impedance value. In one embodiment, the ODT signal 109 is a control signal. In one embodiment, there is one ODT pin per rank which is operable to receive the ODT signal 109 from the memory controller 101. In one embodiment, the second termination impedance value is programmed in a mode register and is accessed in response to the ODT signal 109 being asserted. In one embodiment, the mode register resides in the memory controller 101. In another embodiment, the mode register is a memory mode register (e.g., a DRAM mode register) and resides in each memory rank.

In one embodiment, the ODT unit $104_1$ comprises a pull-up resistor $R_{T1}$ and a pull-down capacitor coupled to the I/O pin. In one embodiment, the value of the resistor $R_{T1}$ is configured/set according to the specifications of the DDR4 I/O interface. As mentioned above, contrary to the termination units of DDR3 I/O interface and earlier DDR I/O interfaces, the ODT units $104_{1-N}$ of the embodiments of the invention do not have an electrical path within the termination units from power supply to ground. Consequently, the ODT units $104_{1-N}$ consume less power than termination units of DDR3 I/O interface and earlier DDR I/O interfaces because the memory controller 101 pulls-up the signal levels on the transmission lines coupled to the ODT units $104_{1-N}$ when the ODT signal 109 is de-asserted.

While the ODT units $104_{1-N}$ are shown with one pull-up resistor, any number of pull-up resistors may comprise the pull-up resistor wherein pull-up resistors are operable to turn on or off via logic (not shown) to achieve a first and/or second termination impedance values. In one embodiment, the first impedance value is 180 Ohms while the second impedance value is 60 Ohms.

In one embodiment, the memory controller 101 comprises a logic unit 108 for dynamically configuring the termination impedance of the ODT units $104_{1-N}$. In one embodiment, the logic unit 108 is operable to set the impedance of the ODT units $104_{1-N}$ to a first finite termination impedance value setting when the memory controller 101 is not accessing memory from the ranks. In such an embodiment, the level of the ODT signal 109 is de-asserted. In one embodiment, the logic unit dynamically switches the impedance value setting of any of the ODT units $104_{1-N}$ from the first termination impedance value setting to a second termination impedance value setting in response to an assertion of the ODT signal 109.

The term assertion refers herein to a transition from a logical low level to a logical high level. Similarly, the term de-assertion refers herein to a transition from a logical high level to a logical low level. Hence, a de-asserted signal is a logical low level signal while an asserted signal is a logical high level signal.

Figure 2A:
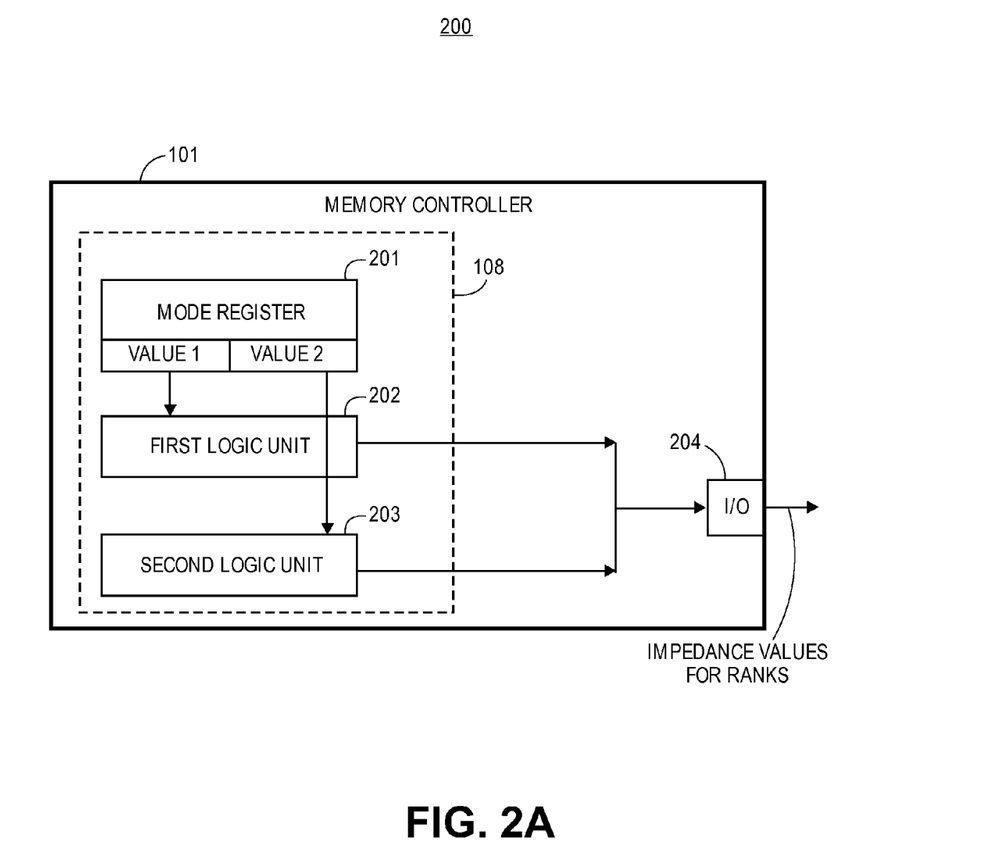
FIG. 2A is a memory controller for dynamically providing finite termination impedance settings to the ranks, according to one embodiment of the invention.

FIG. 2A is a memory controller 200 (same as 101 of FIG. 1) for dynamically providing finite termination impedance settings to the ranks of the memory modules, according to one embodiment of the invention. In one embodiment, the memory controller 101 comprises a register 201 having the first and the second termination impedance values, value 1 and value 2 respectively. In one embodiment, the first and the second termination impedance values are programmable values. In one embodiment, the first and the second termination impedance values are predetermined values set at the time the memory system boots up. In one embodiment, the register 201 is programmable via an operating system. In one embodiment the first and the second termination impedance values are finite values.

In one embodiment as discussed with reference to FIG. 2B, the register 201 is a DRAM Mode Register residing in the ranks $103_{1-N}$ and is operable to store the programmable first and second termination impedance values. In one embodiment, the DRAM Mode Register of each rank of the plurality of ranks $103_{1-N}$ is accessible via an operating system and/or the memory controller 101. In one embodiment the memory controller 101 and/or the Basic Input-Output System (BIOS) is operable to program the DRAM Mode Registers of every rank based on the system memory.

Figure 2B:
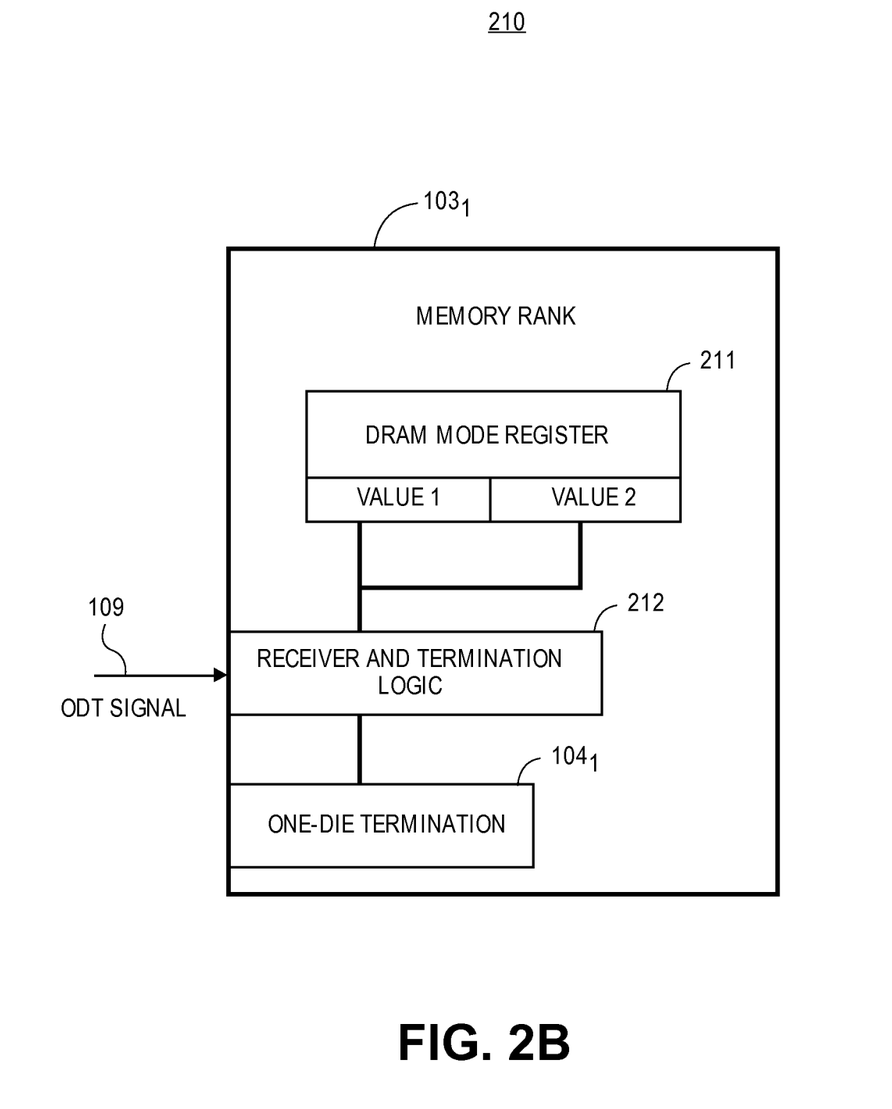
FIG. 2B is a memory rank for dynamically providing finite termination impedance settings to the on-die termination units of the memory rank, according to one embodiment of the invention.

FIG. 2B is a high level logical block diagram 210 of a memory rank $103_1$ comprising a DRAM Mode Register 211 which is operable to store the programmable first and second termination impedance values for the ODT unit $104_1$, according to one embodiment of the invention. So as not to obscure the embodiments of the invention, a single memory rank $103_1$ is being illustrated with a single ODT unit $104_1$ for a single I/O pin/pad. However, the memory rank $103_1$ has multiple ODT units for each pin/pad, and the same description is applicable to all memory ranks $103_{1-N}$, according to the embodiments of the invention. In one embodiment, the memory rank $103_1$ resides in a memory module. In other embodiments, the memory rank $103_1$ does not reside in a memory module. In one embodiment, the memory rank $103_1$ receives the ODT signal 109 from the memory controller 101 via a receiver 212.

In one embodiment, depending on the logical level of the ODT signal 109, a termination logic unit 212 coupled to the receiver 212 (shown as a single block for simplicity purposes) assigns the first or the second termination impedance value to the ODT unit $104_1$. In one embodiment, the termination logic unit 212 comprises the first and the second logic units 202 and 203 discussed with reference to FIG. 2A. In one embodiment, the termination unit 212 receives a signal from the first and the second logic units 202 and 203 discussed below with reference to FIG. 2A to provide the first and the second termination impedance values from the DRAM Mode Register 211 to the ODT unit $104_1$.

In one embodiment, when the ODT signal 109 is de-asserted, the first termination impedance value (value 1), which is also the default termination impedance value for the ODT unit $104_1$, is assigned to the ODT unit $104_1$ from the DRAM Mode Register 211. In one embodiment, when the ODT signal 109 is asserted, the second termination impedance value (value 2) is assigned to the ODT unit $104_1$ from the DRAM Mode Register 211. In one embodiment, the termination impedance values (value 1 and value 2) in the DRAM Mode Register 211 are programmable via hardware or software.

Referring back to FIG. 2A, in one embodiment, the memory controller 101 further comprises a first logic unit 202 and a second logic unit 203. In one embodiment, the first logic unit 202 is operable to assign the first termination impedance value setting from the register 201 to any of the ODT units $104_{1-N}$ that correspond to the ranks $103_{1-N}$ that are not being accessed by the memory controller 101. In such an embodiment, the level of the ODT signal 109 is de-asserted. In one embodiment, the first logic unit 202 is operable to assign the first termination impedance value setting stored in the DRAM Mode register of the rank to the ODT unit of the rank. In one embodiment, the first logic unit 202 is operable to assign the first termination impedance value setting by turning on or off the pull-up resistors of the ODT units $104_{1-N}$ to configure them to have the first termination impedance value setting.

As mentioned above, the level of the ODT signal 109 is de-asserted when setting the first termination impedance value for the ODT units $104_{1-N}$ of the ranks not being accessed by the memory controller 101. In one embodiment, the second logic unit 203 is operable to dynamically switch the first termination impedance value setting to the second termination impedance value settings for the ODT units $104_{1-N}$ of the ranks being accessed in response to the level of the ODT signal 109 being asserted.

In such an embodiment, the second logic unit 203 is operable to turn on or off the resistors from the plurality of resistors of the termination units $104_{1-N}$ that correspond to the I/O pins/pads of the ranks being accessed by the memory controller 101. In one embodiment, the first and the second logic units assign the first and the second termination value settings to the ODT units $104_{1-N}$ via an I/O transmitter 204 of the memory controller 101. In one embodiment, the first and the second logic units are operable assign the first and the second termination value settings to the ODT units $104_{1-N}$ of each rank from the values stored in the DRAM Mode Register of each rank $103_{1-N}$.

Figure 3:
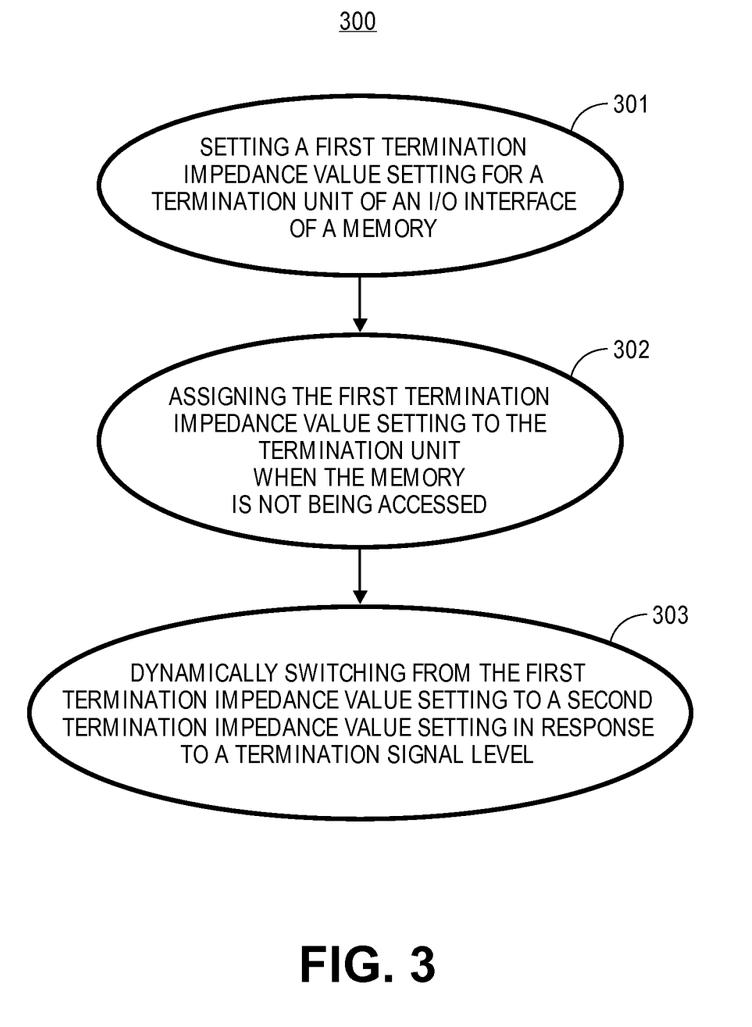
FIG. 3 is a flowchart for dynamically providing finite termination impedance settings to the memory ranks, according to one embodiment of the invention.

FIG. 3 is a flowchart 300 for dynamically providing finite termination impedance settings to the ranks, according to one embodiment of the invention. The flowchart is discussed with respect to the embodiments of FIG. 1 and FIGS. 2A-B.

At block 301 a first impedance value is set in the register 201 of the memory controller 101 or in the one or more ranks $103_{1-N}$. As mentioned above, the first impedance value (value 1) is a finite impedance value for any of the ODT units $104_{1-N}$ of the I/O pins/pads that corresponds to the ranks that are not being accessed by the memory controller 101. At block 301, a second impedance value (value 2) is also set in the register 201 of the memory controller 101 or in the one or more ranks $103_{1-N}$. As discussed above, in one embodiment, the register 201 resides in the individual ranks $103_{1-N}$ (See, DRAM Mode Register 211 of FIG. 2B). The second impedance value is also a finite impedance value for any of the ODT units $104_{1-N}$ of the I/O pins/pads that correspond to the ranks being accessed by the memory controller 101. In one embodiment, the memory controller 101 is operable to set the first and the second impedance values via an operating system.

At block 302, the first termination impedance value setting is assigned via the first logic unit 202 and/or via the logic unit 212 of FIG. 2B to any of the ODT units $104_{1-N}$ of the I/O pins that correspond to the ranks not being accessed by the memory controller 101. In one embodiment, the first termination impedance value is a default impedance value for the ODT units $104_{1-N}$ of the I/O pins/pads that correspond to the ranks not being accessed by the memory controller 101. In one embodiment, the first termination impedance value is assigned to the ODT units $104_{1-N}$ that are not being accessed. In such an embodiment, the level of the ODT signal 109 de-asserts.

At block 303, the second logic unit 203 and/or the logic unit 212 of FIG. 2B dynamically switches the first termination impedance value setting to the second termination impedance value setting in response to the assertion of the ODT signal 109. At block 303, the second impedance value setting is assigned to any of the ODT units $104_{1-N}$ of the I/O pins/pads that correspond to the ranks being accessed by the memory controller 101. In such an embodiment, the level of the ODT signal 109 asserts.

The above embodiments allow different ranks of a memory system from among the ranks $103_{1-N}$ of the one or more memory modules $102_{1-N}$ to have different programmable finite termination impedance value settings depending on which rank is being accessed and the logical level of the ODT signal 109. The finite impedance termination values dynamically switch from the first finite termination impedance value setting to the second finite termination impedance value setting and vice-a-versa in response to the ranks being accessed and the level of the ODT signal 109.

The above embodiments result in improved timing and voltage margins for the entire memory system compared to memory systems that only allow switching between a high impedance (infinite impedance) value setting and a finite impedance value setting. One reason for the improved timing and voltage margins is the reduction of signal reflections on the transmission lines between the memory controller and the ranks caused by the different finite termination impedance value settings for ODT units when the memories are being accessed and when they are not being accessed. The embodiments of the invention thus allow a memory system with DDR4 I/O interface to have a finite programmable termination impedance as its default impedance value.

Embodiments of the invention are also implemented via programmable computer-executable instructions stored on a machine-readable storage medium. For example, the method of FIG. 3 is programmable and executable by a computer. The machine-readable storage medium may include, but is not limited to, flash memory, optical disks, CD-ROMs, DVD ROMs, RAMs, EPROMs, EEPROMs, magnetic or optical cards, or other type of machine-readable storage media suitable for storing electronic or computer-executable instructions. For example, embodiments of the invention may be downloaded as a computer program which may be transferred from a remote computer (e.g., a server) to a requesting computer (e.g., a client) by way of data signals via a communication link (e.g., a modem or network connection).

Figure 4:
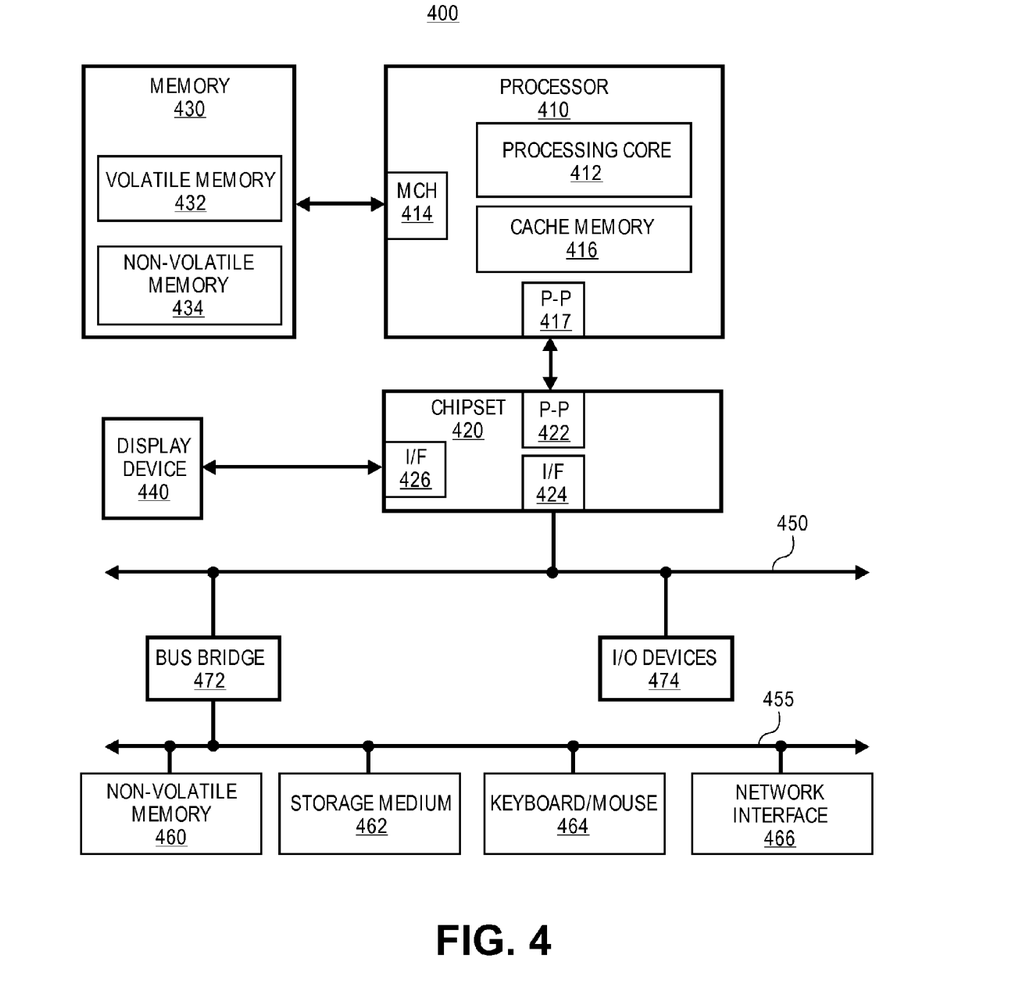
FIG. 4 is computer system to implement the method for providing dynamic memory termination impedance settings to the memory ranks, according to one embodiment of the invention.

FIG. 4 illustrates a system 400 to implement the methods disclosed herein, according to one embodiment of the invention. In one embodiment, the system 400 includes, but is not limited to, a desktop computer, a laptop computer, a netbook, a notebook computer, a personal digital assistant (PDA), a server, a workstation, a cellular telephone, a mobile computing device, an Internet appliance or any other type of computing device. In another embodiment, the system 400 used to implement the methods disclosed herein may be a system on a chip (SOC) system.

In one embodiment, the processor 410 has a processing core 412 to execute instructions of the system 400. In one embodiment, the processing core 412 includes, but is not limited to, pre-fetch logic to fetch instructions, decode logic to decode the instructions, execution logic to execute instructions and the like. In one embodiment, the processor 410 has a cache memory 416 to cache instructions and/or data of the system 400. In one embodiment, the cache stores the instructions to execute the method of FIG. 3. In another embodiment of the invention, the cache memory 416 includes level one, level two and level three, cache memory, or any other configuration of the cache memory within the processor 410.

The memory controller 101, which is also referred to as the memory control hub (MCH) 414, is operable to perform functions that enable the processor 410 to access and communicate with a memory 430 that includes a volatile memory 432 and/or a non-volatile memory 434. The volatile memory 432 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 434 includes, but is not limited to, flash memory, phase change memory (PCM), read-only memory (ROM), electrically erasable programmable read-only memory (EEPROM), or any other type of non-volatile memory device.

The memory 430 stores information and instructions to be executed by the processor 410. In one embodiment, memory 430 may also store temporary variables or other intermediate information while the processor 410 is executing instructions. In one embodiment, chipset 420 connects with processor 410 via Point-to-Point (PtP or P-P) interfaces 417 and 422. In one embodiment, chipset 420 enables processor 410 to connect to other modules in the system 400. In one embodiment of the invention, interfaces 417 and 422 operate in accordance with a PtP communication protocol such as the Intel® QuickPath Interconnect (QPI) or the like.

In one embodiment, chipset 420 connects to a display device 440 via an interface 426. In one embodiment, the display 440 includes, but is not limited to, liquid crystal display (LCD), cathode ray tube (CRT) display, or any other form of visual display device. In one embodiment of the invention, processor 410 and chipset 420 are merged into a SOC. In addition, chipset 420 connects to one or more buses 450 and 455 that interconnect various modules 474, 460, 462, 464, and 466. In one embodiment, buses 450 and 455 may be interconnected together via a bus bridge 472 if there is a mismatch in bus speed or communication protocol. In one embodiment, chipset 420 couples with, but is not limited to, a non-volatile memory 460, a mass storage device(s) 462, a keyboard/mouse 464, and a network interface 466 via interface 424.

In one embodiment, the mass storage device 462 includes, but is not limited to, a solid state drive, a hard disk drive, an universal serial bus flash memory drive, or any other form of computer data storage medium. In one embodiment, network interface 466 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 4 are depicted as separate blocks within the system 400, the functions performed by some of these blocks may be integrated within a single semiconductor circuit or may be implemented using two or more separate integrated circuits. For example, although the cache memory 416 is depicted as a separate block within the processor 410, the cache memory 416 can be incorporated into the processor core 412 respectively. In one embodiment, the system 400 may include more than one processor/processing core in another embodiment of the invention.

Figure 5A:
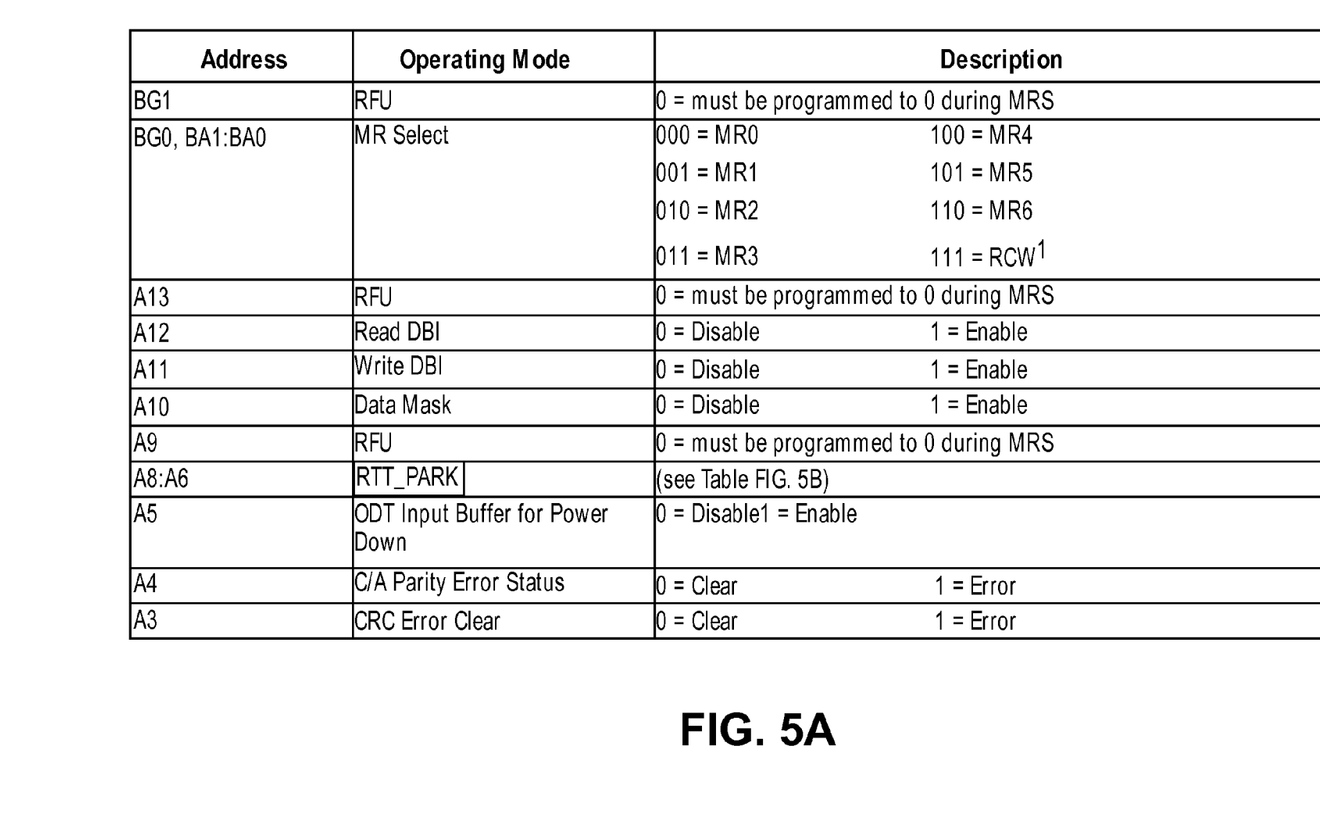
FIG. 5A is a conceptual illustration of a mode register that may be utilized to control on-die termination (ODT) modes.

FIG. 5A is a conceptual illustration of a mode register that may be utilized to control on-die termination (ODT) modes. The example of FIG. 5A illustrates a portion of one mode register; however, a memory system may utilize multiple mode registers of varying sizes. The DDR4 specification, for example, includes seven mode registers. For simplicity, only portions of the mode register(s) are illustrated in FIG. 5A, which corresponds to Mode Register 5 of the DDR4 specification.

Figure 5B:
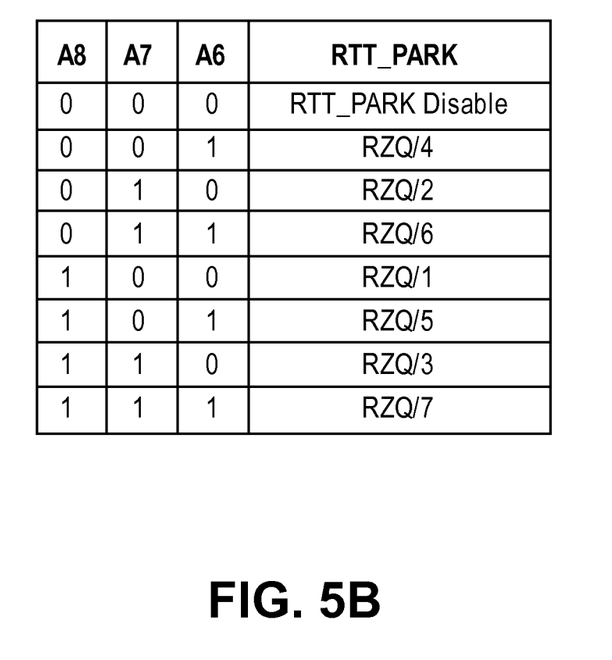
FIG. 5B is a truth table for one embodiment of a technique to control ODT modes.

The mode register of FIG. 5A includes three bits (e.g., Bits A8:A6) corresponding to the RTT_PARK operating mode. FIG. 5B is a truth table for one embodiment of a technique to control ODT modes with the RTT_PARK field in the mode register of FIG. 5A. By using three bits, the mode register supports eight termination values. In alternate embodiments, other numbers of termination values may be supported.

Figure 6:
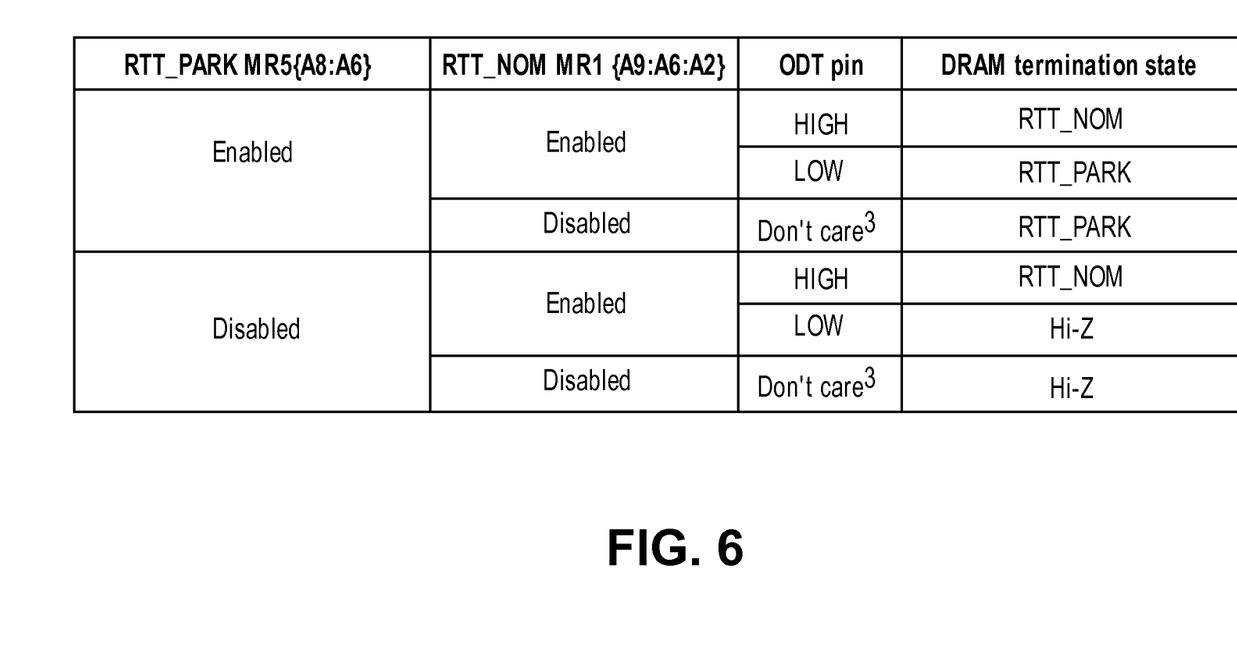
FIG. 6 is a state table for one embodiment of an ODT technique.

FIG. 6 is a state table for one embodiment of an ODT technique. The state table of FIG. 6 corresponds to the RTT_PARK modes of FIGS. 5A and 5B. Using the state table of FIG. 6, if there is a Write command along with ODT high, the DRAM turns on RTT_WR not RTT_NOM. If there is a Read command, the DRAM disables data termination regardless of the ODT pin and goes to Driving Mode.

The term operable used herein means that the device, module, system, logic unit, protocol etc, is able to operate or is adapted to operate for its desired functionality when the device, module, system, or logic unit is in off-powered state.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

While the invention has been described in conjunction with specific embodiments thereof, many alternatives, modifications and variations of such embodiments will be apparent to those of ordinary skill in the art in light of the foregoing description. For example, the dynamic switching of the termination impedance values from the first impedance value to the second impedance value may occur when the ODT signal 109 de-asserts instead of asserting. In such an embodiment, ODT signal 109 is de-asserted in response to a memory access from a rank. In one embodiment, the memory coupled to the memory controller 101 is a standalone DRAM.

The embodiments of the invention are intended to embrace all such alternatives, modifications, and variations as to fall within the broad scope of the appended claims.

We claim:
1. A system comprising:
   a synchronous dynamic random access memory (SDRAM) device, the SDRAM device comprising at least
   a memory array,
   a mode register to hold at least one mode register bit, wherein the value of the at least one mode register bit is to determine an on-die termination (ODT) mode based on whether the SDRAM device is selected for memory access or non-selected for memory access, and
   ODT circuitry coupled with the mode register to provide a programmable termination value based on the ODT mode in accordance with a state table separate from the mode register, wherein the programmable termination value corresponds to RTT PARK to identify a finite termination value for the SDRAM device when it is non-selected for memory access, and ODT is not enabled for the SDRAM device; and
   a memory controller coupled with the SDRAM device, the memory controller comprising at least command and control logic to control the ODT mode of the SDRAM and to control selection of the SDRAM device for memory access.

2. The system of claim 1 wherein the SDRAM device conforms to a Double Data Rate 4 (DDR4) specification.

3. The system of claim 2, wherein the ODT circuitry provides programmable termination when the ODT mode is one of RTT_PARK, RTT_WR and RTT_NOM.

4. The system of claim 1 wherein the SDRAM device conforms to a Low Power Double Data Rate 4 (LPDDR4) specification.

5. The system of claim 1 wherein the ODT circuitry provides VDDQ termination.

6. The system of claim 1 wherein the ODT circuitry is to transition the ODT value from a first programmable value to a second programmable value.

7. A synchronous dynamic random access memory (SDRAM) device comprising:
   a memory array,
   a mode register to hold at least one mode register bit, wherein the value of the at least one mode register bit is to determine an on-die termination (ODT) mode based on whether the SDRAM device is selected for memory access or non-selected for memory access, and
   ODT circuitry coupled with the mode register to provide a programmable termination value based on the ODT mode in accordance with a state table separate from the mode register by an associated memory controller that controls selection of the SDRAM device and controls the ODT mode of the SDRAM, wherein the programmable termination value corresponds to RTT PARK to identify a finite termination value for the SDRAM device when it is non-selected for memory access, and ODT is not enabled for the SDRAM device.

8. The SDRAM device of claim 7 wherein the SDRAM device conforms to a Double Data Rate 4 (DDR4) specification.

9. The SDRAM device of claim 7 wherein the SDRAM device conforms to a Low Power Double Data Rate 4 (LP-DDR4) specification.

10. The SDRAM device of claim 9, wherein the ODT circuitry provides programmable termination when the ODT mode is one of RTT_PARK, RTT_WR and RTT_NOM.

11. The SDRAM device of claim 7 wherein the ODT circuitry provides VDDQ termination.

12. The SDRAM device of claim 7 wherein the ODT circuitry is to transition the ODT value from a first programmable value to a second programmable value.

13. A memory controller comprising:
   command and control circuitry to control memory access to a memory device, including controlling whether the memory device is selected for memory access or non-selected for memory access;
   command and control circuitry to control an on-die termination (ODT) mode of the memory device; and
   I/O (input/output) connectors to couple to the memory device over multiple signals lines, wherein the memory device includes ODT circuitry to terminate the signal lines, wherein the memory controller is to set a value of a mode register of the memory device to program a termination value to be used by the ODT circuitry via one or more commands send via the I/O connectors to the memory device, wherein the ODT modes have separately programmable termination values depending on whether the memory device is selected for memory access or non-selected for memory access and depending on a value set in a state table separate from the mode register for the respective ODT modes, wherein the programmable termination value corresponds to RTT PARK to identify a finite termination value for the SDRAM device when it is non-selected for memory access, and ODT is not enabled for the SDRAM device.

14. The memory controller of claim 13, wherein the ODT circuitry provides programmable termination when the ODT mode is one of RTT_PARK, RTT_WR and RTT_NOM.

15. The memory controller of claim 13 wherein the ODT circuitry provides VDDQ termination.

16. The memory controller of claim 13 wherein the memory controller is contained within a single integrated circuit with at least one processor core.

17. The memory controller of claim 13 wherein the ODT circuitry is to transition the ODT value from a first programmable value to a second programmable value.

* * * * *